(12) United States Patent
Arques

(10) Patent No.: US 7,183,550 B2
(45) Date of Patent: Feb. 27, 2007

(54) METHOD AND APPARATUS FOR ANALOGUE PROCESSING OF THE SIGNAL EMITTED BY A PARTICLE DETECTOR

(76) Inventor: Marc Arques, 48, rue Maurice Barrès, 38100 Grenoble (FR)

( * ) Notice: Subject to any disclaimer, the term of this patent is extended or adjusted under 35 U.S.C. 154(b) by 124 days.

(21) Appl. No.: 10/451,943

(22) PCT Filed: Dec. 27, 2001

(86) PCT No.: PCT/FR01/04215

§ 371 (c)(1),
(2), (4) Date: Jul. 6, 2004

(87) PCT Pub. No.: WO02/054087

PCT Pub. Date: Jul. 11, 2002

(65) Prior Publication Data

US 2004/0245468 A1 Dec. 9, 2004

(30) Foreign Application Priority Data

Dec. 28, 2000 (FR) .................................... 00 17220

(51) Int. Cl.
*G01T 1/00* (2006.01)
(52) U.S. Cl. .................................... 250/336.1; 250/395
(58) Field of Classification Search ............. 250/336.1, 250/395
See application file for complete search history.

(56) References Cited

U.S. PATENT DOCUMENTS 4,036,057 A 7/1977 Morais
4,880,981 A 11/1989 Johnston
4,920,548 A * 4/1990 Gaussa et al. ............... 376/255
5,204,631 A 4/1993 Hobbs
5,854,489 A 12/1998 Verger et al.
2002/0079932 A1* 6/2002 Andoh ......................... 327/58

FOREIGN PATENT DOCUMENTS

DE 3718305 C1 9/1988

OTHER PUBLICATIONS

Barnett, T.G., "Ideas for Design, Build Low-Cost Window Comparator," *Electronic Design*, Jul. 11, 1991, pp. 136-137, Penton Publishing, Cleveland, Ohio.

* cited by examiner

*Primary Examiner*—Constantine Hannaher
(74) *Attorney, Agent, or Firm*—Brinks Hofer Gilson & Lione

(57) ABSTRACT

Devices and methods for processing a signal emitted by a particle detector in which the methods include detecting in the signal the portions where the signal is greater than a predetermined value V1, measuring the maximum value Vmax reached by the signal in each of the portions, and associating with each of the portions an analog quantity Q which, at least in a predetermined range of values DELTA V1 of the maximum value Vmax, is an increasing function of (Vmax−V1).

14 Claims, 9 Drawing Sheets

METHOD AND APPARATUS FOR ANALOGUE PROCESSING OF THE SIGNAL EMITTED BY A PARTICLE DETECTOR

PRIORITY CLAIM

This application claims priority to French Patent Application No. 0017220, filed Dec. 28, 2000.

TECHNICAL FIELD

The present invention relates to the analysis of a flux of particles received by a particle detector during a given interval, for example with the aim of counting these particles or measuring their energy. It relates more particularly to method of analysis using analogue processing of the signal emitted by the said detector, as well as the devices and apparatus intended for implementing these methods.

BACKGROUND

The detectors considered in the present invention are known detectors, whether of the point or matrix type, and regardless of the materials, semiconducting or otherwise, of which they are composed. The signals emitted by these detectors can either be electric currents, or they can be of a physical nature and can be converted to electric current in a known manner. It will simply be assumed that reception of a particle by the detector triggers an output signal having the form of a pulse of a certain width and the maximum amplitude of which is representative of the energy of this particle.

In the rest of the description, for the purpose of clarity, reference will be made to the detection of "photons" (more particularly measurement of the characteristics of electromagnetic radiation), but it is to be borne in mind that the invention is completely independent of the nature of the particles detected.

An important factor limiting the quality of signal processing is the background noise which is always present in the current emitted by the detector. This background noise includes at least two components. The first component is the "dark current", more particularly, the fluctuating current, of thermal origin, emitted by the detector even when it is not receiving any photons. The second component is the "transient decay current", more particularly the fluctuating current that is manifested for a certain time after reception of a photon by the detector; in detectors using semiconducting materials, this transient decay current is due in particular to crystal imperfections in these materials.

Let us examine the effects of this background noise on the accuracy of measurements carried out by the known methods.

If for example a measurement system based on integration is used, by means of which the total energy of the radiation received by the detector during a predetermined time is measured, the current from the detector is integrated over this time. A faithful representation of the energy of the photons received then requires taking into account all of the current produced, including the low values: use of a threshold of detection of this current would therefore be detrimental, in that it would cause a loss of information. However, the measured current includes, as explained above, a component due to the background noise, to which an exact value cannot be ascribed because of the fluctuations due to thermal drift and to the transient decay current, and because of the random noise associated with this component. In the known systems, the current due to the background noise is integrated in the measured value, and then a quantity that is only an estimated average value of the effect of the background noise is subtracted, in order to obtain the representative value of the radiation energy.

As another example, when a measurement system based on counting is used, by means of which the number of photons of energy E above a threshold $E_2$ received by the detector during a predetermined time is measured, a suitable device (for example a bistable circuit) is triggered when the signal exceeds a certain threshold value corresponding to $E_2$, and the said device is reset when the signal falls below this threshold value. Admittedly, there is then nothing to prevent the placement, at the detector output, of a system for filtering the continuous component from the background noise. However, the problem is that it is not possible to distinguish an increase in current due to the arrival of a photon from the increase in current caused by a fluctuation of the background noise, unless the said threshold value is set high enough so that the fluctuations can practically never exceed it. In addition, in these conventional measurement systems, the bistable circuits or similar devices produce parasitic coupling. In practice, this threshold cannot therefore be set very low.

SUMMARY

The invention applies to any field where the analysis of a flux of particles, and in particular their counting or measurement of their energy, can be useful, for example in the case when these particles are photons, in radiology, in fluoroscopy or in video imaging. It is particularly suited to fields requiring a method of signal processing which, though of high quality (in the sense that the said method permits very accurate measurements of the flux), does this using a device of small size; this is in particular the case when this device is composed not of a single detector (pixel), but of a matrix of pixels, because the size of the electronic apparatus used is then limited by the spacing of the pixels.

A subject of the invention is therefore methods, and relatively compact devices implementing these methods, which are intended to reduce the sensitivity of measurements of particle flux, on the one hand to fluctuations of the background noise present in the signals emitted by the detectors, and on the other hand to disturbances caused by the measurement electronics.

With this aim, the invention includes a method of processing the signal produced by a particle detector, the said method being characterized in that the portions where the signal is above a predetermined value $V_1$ are detected in the the signal, the maximum value $V_{max}$ reached by the signal in each of the said portions is measured, and an analogue quantity Q which, at least over a predetermined range of values $\Delta V_1$ of the said maximum value $V_{max}$, is a, for example linearly, increasing function of $(V_{max}-V_1)$, is assigned to each of the said portions.

In fact, the invention exploits the fact that, in conventional detectors, the "peak" of each current pulse caused by an incident particle is proportional to the energy of that particle, or is at least representative of this energy (assuming for the purpose of clarity that the the pulse has positive values: the reader will easily transfer the characteristics of the invention to the case when negative values are measured). The method according to the invention thus only takes into consideration this peak (in the form of $V_{max}$), without taking into account the rising part and the falling part of each pulse, and to an even lesser extent the value of the signal between the pulses, so that the effect of fluctuations of the background noise is felt only for the brief duration of these pulses, in the course of which the measurements are carried out. This leads to an appreciable improvement of the quality of the measurements relative to the conventional methods.

With regard to the practical choice of the detection threshold $V_1$, it is clear that for this thresholding to be effective, generally a value of $V_1$ must be chosen that is above the average level of the background noise (or must be chosen as positive if, at the detector output, the continuous component is filtered from the background noise). This being so, the higher the value of $V_1$, the more the fluctuations of the background noise are avoided. However, the presence of this threshold $V_1$ prevents the detection of photons, the energy of which (if applicable) is lower than the energy $E_1$ associated with a voltage pulse peaking at $V_1$; consequently, the higher the value of $V_1$, the larger will be the energy band for which photons of energy belonging to this band will not be able to be detected. Therefore the value of $V_1$ must be chosen carefully, using these principles, as a function of the particular application.

The variation, according to the invention, of the analogue quantity Q over the range of values $\Delta V_1$ naturally makes it possible to take account of the energy variations of the photons received, and in a way that can differ from one application of the invention to another. In photometry, for example, it will be possible to prefer a linear behaviour of the analogue quantity Q as a function of the energy E of the photon. For photon counting, the increasing (but not necessarily linear) function Q(E) means that it is possible to implement "progressive thresholding" about a predetermined energy, as explained below.

According to particular characteristics of the invention, there is assigned to each of the said portions an analogue quantity Q which is an increasing function, for example linear, of $(V_{max}-V_1)$ if the maximum value $V_{max}$ is below a second predetermined value $V_2$, and remains constant at its value for $V_{max}$ equal to $V_2$ if the maximum value $V_{max}$ is above this second value $V_2$, at least over a predetermined range of values $\Delta V_2$ of the said maximum value $V_{max}$.

These particular characteristics are very advantageous when the invention is applied to photon counting, which consists, it will be recalled, of measuring the number of photons with energy E above a threshold $E_2$ received by the detector during a predetermined time. In fact, an analogue quantity Q proportional to $(E-E_1)$ will then be assigned to every photon of energy E between $E_1$ and $E_2$, and an analogue quantity $Q_2$ proportional to $(E_2-E_1)$ will be assigned to every photon of energy E greater than $E_2$. In this way, progressive thresholding about $E=E_2$ is implemented.

It will be noted that this progressive thresholding has the advantage, in comparison with very abrupt thresholding, of making it possible to take account of peaks, the real energy of which is minimized by a particularly low instantaneous level of background noise: in fact, the probability that a particle with apparent energy (as detected) below the counting threshold that has been adopted still has a real energy above this threshold increases as the difference between this apparent energy and the counting threshold decreases. This progressive thresholding can therefore be understood as the application, to the apparent energy of the observed peaks of a likelihood coefficient that approaches 1 as this apparent energy approaches $E_2$. In reality, the counting threshold (above which it is desired to characterize the particles) is below $E_2$ (but it is not necessary to know it) to the extent that there may also be peaks with apparent energy greater than their real energy because of a particularly high instantaneous level of the background noise: according to this approach, $E_2$ is the energy level for which it is considered that it is certain, regardless of the instantaneous value of the background noise, that it is indeed a particle that has a real energy at least equal to the above-mentioned counting threshold.

Furthermore, this progressive thresholding makes it possible to take account of the fact that, in the analysis of a physical phenomenon, the energy transition between the significant particles and those that are not, is not necessarily abrupt, and the particles with energy close to the threshold can contribute to the phenomenon which it is being attempted to characterize; progressive thresholding can then be analysed as assignment of a coefficient of efficiency of the peaks that moves closer to 1 as the energy level moves closer to $E_2$.

These two approaches can of course be combined, and the choice of the thresholds and of the slope of the rising portion makes it possible to take best account of what it is desired to characterize; this choice can be made, for example, following tests conducted in accurately known conditions. It must be understood here that the linear form of such a rising curve is particularly practical, especially because of the small number of coefficients to be chosen, but that other forms are possible, in order to take best account of the results that are expected from progressive thresholding.

This progressive thresholding makes it possible to position the level above which the signal is measured, very close to the level of the background noise: in fact, a very low, but non-zero, likelihood coefficient is applied to the low peaks, taking account of the probability that this low peak is representative not of a fluctuation of the background noise but of a particle that should be accounted for.

It can therefore be seen that, relative to the conventional methods, the invention offers the advantage of counting photons very accurately even when the energy $E_2$ is very low. An additional advantage is the absence of parasitic signals such as those produced, in conventional bistable-circuit counters, by the switchings of this bistable circuit associated with incrementing of the counter.

According to even more particular characteristics of the invention, there is assigned to each of the said portions an analogue quantity Q which is an increasing function of $(V_{max}-V_1)$ if the maximum value $V_{max}$ is below a second predetermined value $V_2$, remains constant at its value for $V_{max}$ equal to $V_2$ if the maximum value $V_{max}$ is between this second value $V_2$ and a third predetermined value $V_3$, and is a decreasing function of $V_{max}$ if the maximum value $V_{max}$ is above this third value $V_3$, at least over a predetermined range of values $\Delta V_3$ of the maximum value $V_{max}$.

Owing to these arrangements, it will be possible in particular to obtain a function Q(E) that is tooth-shaped, or approaches a Gaussian curve. It will thus be possible to favour, in the radiation received, the photons belonging to a relatively narrow energy band, these photons being particularly significant in the application envisaged.

According to another aspect, the invention relates to various devices.

Firstly, it thus relates to a device for processing the signal produced by a particle detector, the device comprising a conversion unit that is able to convert any pulse of current emitted from the said detector into a voltage pulse V, an analogue circuit including an electric charge storage device $D_3$, a first electric charge receiver $D_1$ that can be fed by the charge storage device $D_3$ in a manner controllable by means of the voltage V, and a second electric charge receiver $D_2$ that can also be fed by the charge storage device $D_3$ in a manner controllable by means of the voltage V, and an apparatus for measuring the electric charge Q contained in the second charge receiver $D_2$, the analogue circuit being designed in such a manner that each voltage pulse V produces the following effects successively within the device: the charge storage device $D_3$ is isolated from the first charge receiver $D_1$, the charge storage device $D_3$ is connected to the second charge receiver $D_2$ when the voltage V exceeds a predetermined value $V_1$, an electric charge Q that is an increasing function of $(V-V_1)$ passes from $D_3$ to $D_2$, the connection between $D_3$ and $D_2$ is cut when the voltage V begins to decrease after reaching a maximum value $V_{max}$, and $D_3$ is reconnected to $D_1$ which restores the lost charge Q in $D_3$.

Secondly, the invention also relates to a device for processing the signal produced by a particle detector, the device comprising a conversion unit that is able to convert any pulse of current emitted from the detector into a voltage pulse V, an analogue circuit including a charge storage device $M_2$, a first electric charge receiver $D_1$ that can be fed by the charge storage device $M_2$ in a manner controllable by means of the voltage V, and a second electric charge receiver $D_2$ that can also be fed by the charge storage device $M_2$ in a manner controllable by means of the voltage V, and an apparatus for measuring the electric charge Q contained in the second charge receiver $D_2$, the analogue circuit being designed in such a manner that each voltage pulse V produces the following effects successively within the device:

the charge storage device $M_2$ is isolated from the first charge receiver $D_1$, the charge storage device $M_2$ is connected to the second charge receiver $D_2$ when the voltage V exceeds a first predetermined value $V_1$, an electric charge Q proportional to $(V-V_1)$ passes from $M_2$ to $D_2$ if the voltage V does not exceed a second predetermined value $V_2$, or proportional to $(V_2-V_1)$ if the voltage V exceeds the said second value $V_2$, the connection between $M_2$ and $D_2$ is cut when the voltage V begins to decrease after reaching a maximum value $V_{max}$, and $M_2$ is reconnected to $D_1$ which restores the lost charge Q in $M_2$.

Thirdly, the invention also relates to a device for processing the signal produced by a particle detector, the device being characterized in that it comprises two circuits similar to that briefly described for the second device, and both receiving the voltage pulse V emitted from a conversion unit, the parameters of these two circuits being controlled independently of one another, and an analogue subtractor that is able to produce an output signal equivalent to the difference Q between the respective analogue charges Q' and Q'' transferred to the respective second charge receivers $D'_2$ and $D''_2$ contained in the circuits.

Finally, the invention fourthly relates to a device for processing the signals produced by a set of particle detectors, the device being characterized in that at least one of these signals is processed by means of a device such as those briefly described above.

For each of these devices, the measurements are carried out by sampling and reading this analogue quantity Q at predetermined points of time. Since this quantity depends on $V_{max}$, it is properly representative of the energy of the photon giving rise to the pulse. In particular, in order to count the photons received since the preceding measurement, it is sufficient to divide Q by $Q_2$.

The advantages offered by these devices are therefore essentially the same as those offered by the methods according to the invention, but it will be noted in addition that they can easily be constructed using conventional semiconductor components, as will be shown in the detailed description given below, hence the small overall size of these devices, as well as a low cost of manufacture. These properties arise in particular from the fact that, according to the invention, processing of the signal from the detector is purely analogue. Naturally, in certain applications it will prove useful to connect an analogue-digital converter to a device according to the invention, in order to permit digital processing of the information obtained, especially if constraints of cost and overall size are secondary in the application envisaged.

Finally, the invention relates to various apparatus for analysing a flux of particles incorporating at least one device such as those described briefly above.

BRIEF DESCRIPTION OF THE DRAWING

Other aspects and advantages of the invention will become evident on reading the detailed description, given below, of particular embodiments given as non-limitative examples. This description refers to the appended drawings, in which.

DETAILED DESCRIPTION

Figure 1:
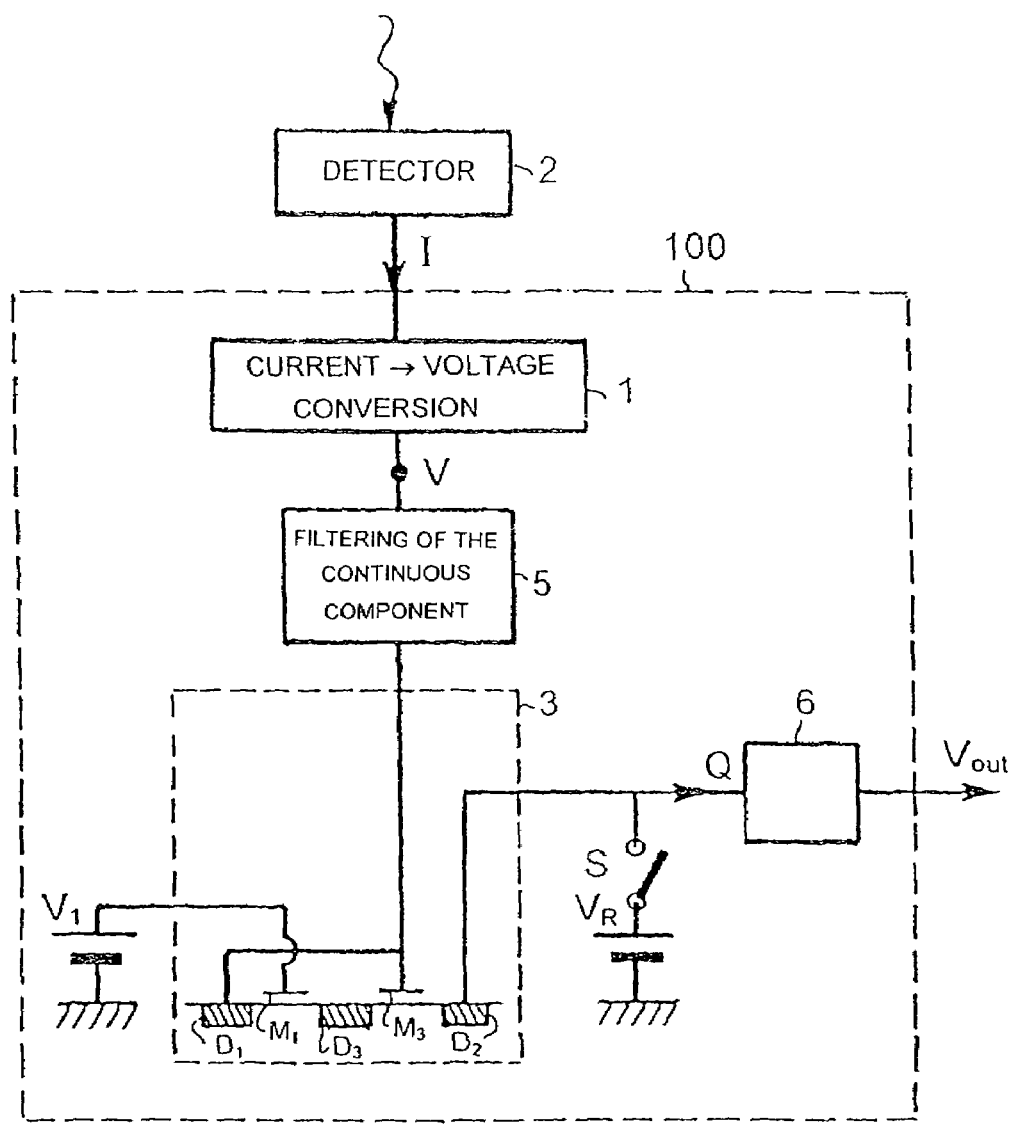
FIG. 1 schematically represents a device according to a first embodiment of the invention.

FIG. 1 represents, according to a first embodiment of the invention, a device 100 that is intended for processing the signals emitted by a photon detector 2.

This detector 2 emits, in response to the arrival of a photon on its receiving surface, a pulse of current I. According to the invention, firstly this pulse of current I is converted to a voltage pulse V with the help of a suitable conventional unit 1.

The continuous component is then, optionally, removed from the resulting signal by means of a conventional filtering unit 5. It will be recalled that this continuous component corresponds to the average value of the dark current and of the transient decay current leaving the detector 2, whatever this detector.

The signal is then processed by the analogue circuit 3. The voltage pulse V is applied directly to a diffusion zone $D_1$ which performs the role here of an electric charge receiver, and to the gate of a MOS (metal oxide semiconductor) transistor $M_3$. More precisely, in the embodiment represented, a transistor of the NMOS type was chosen for $M_3$, i.e. with conduction by electrons; the surface channel potential V* of $M_3$ is therefore lower here than V by a certain amount $\epsilon$.

Between $M_3$ and $D_1$, there is another diffusion zone $D_3$, which performs the role of charge storage device, and another NMOS transistor $M_1$, the gate of which is maintained at a fixed potential $V_1$; the channel potential $V_1$* of $M_1$ is less than $V_1$ by an amount close to $\epsilon$.

Finally, after the transistor $M_3$, there is a final diffusion zone $D_2$ which is intended to receive the analogue charge Q according to the invention.

In order to carry out a measurement, this diffusion zone $D_2$ is briefly brought to a predetermined fixed potential $V_R$ (by closing and then opening the switch S). The charge Q accumulated in $D_2$ then produces a voltage change that is read by a measuring apparatus 6 (for example a capacitor with voltmeter, or a ballistic galvanometer) supplying the output signal from the device $V_{out}$.

FIG. 2 represents the main stages in the operation of the device shown in FIG. 1, showing schematically, for each stage, the relationship between the potentials of $D_1$, $D_2$, $D_3$, and of the channels of $M_1$ and $M_3$, in the case when the value of $V_1$ is chosen in such a manner that the value of $V_1$*, equal to $V_1$-$\epsilon$, is greater than the average value of the background noise, in the device 100 without the filtering unit 5 (or is positive, if such a unit 5 is incorporated).

Figure 2A:
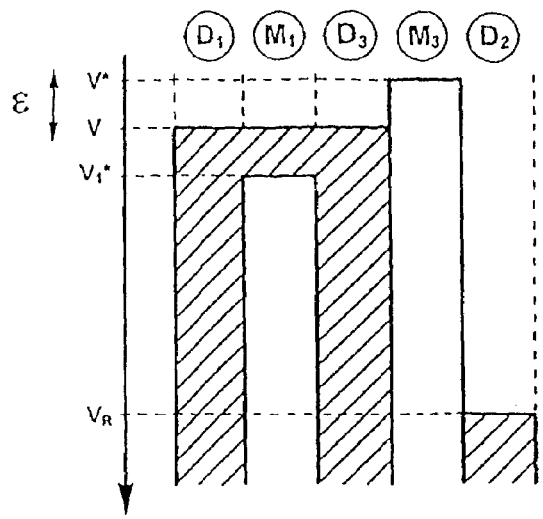
FIGS. 2a to 2d represent the main stages in the operation of the device shown in FIG. 1, FIG. 3 schematically represents the relationship between the energy E of an incident photon and the analogue quantity Q that is associated with it, when using the device shown in FIG. 1, FIG. 4 schematically represents a device according to a second embodiment of the invention.

FIG. 2a shows the values of these potentials in the absence of a pulse from detector 2. It can be seen in particular that the charges located in $D_3$ can flow into $D_1$, but not into $D_2$, because of the potential barrier presented by the channel of $M_3$.

Figure 2B:
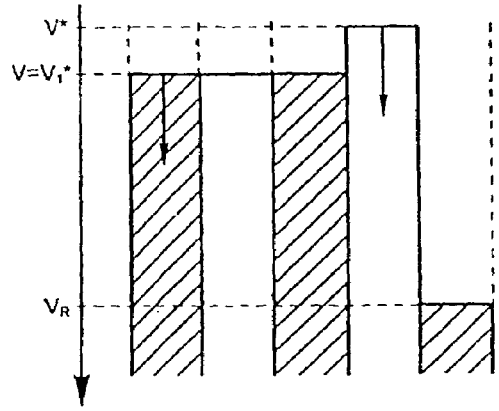

Following the reception of a photon by the detector (or because of a fluctuation of the background noise), the potentials of $D_1$ (more particularly V) and of $M_3$ (more particularly V* equal to V-$\epsilon$) increase in concert. If the pulse is strong enough, the stage shown in FIG. 2b is reached, where communication between $D_3$ and $D_1$ is cut.

Figure 2C:
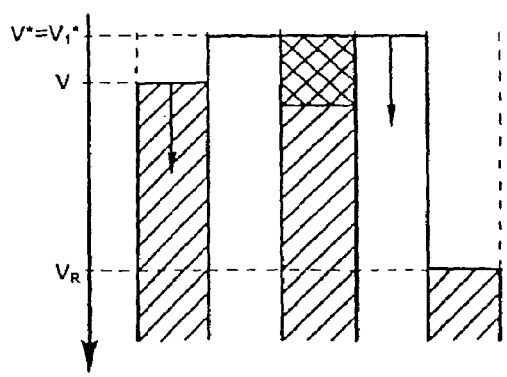
Figure 2D:
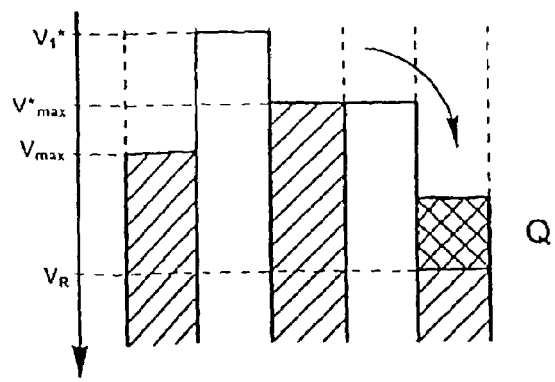

If the pulse is strong enough, we then reach the stage shown in FIG. 2c, where the charges contained in $D_3$ can begin to flow into $D_2$. The quantity of charges thus moved for a given voltage V depends on the parasitic capacity of $D_3$.

When the pulse V reaches the maximum $V_{max}$ (FIG. 2d), the charge moved to $D_2$ has reached a certain value Q.

The voltage V then decreases, and $M_3$ immediately forms a potential barrier between $D_3$ and $D_2$, so that no additional charge flows to $D_2$. Therefore the charge Q preserves the value which it acquired at the peak of the pulse.

Finally, one returns to the situation in FIG. 2a until a new pulse arrives. It is necessary to ensure, taking into account the practical frequency of arrival of the photons, that recharging of $D_3$ from $D_1$ is fast enough for the device to be ready for this new pulse.

Figure 3:
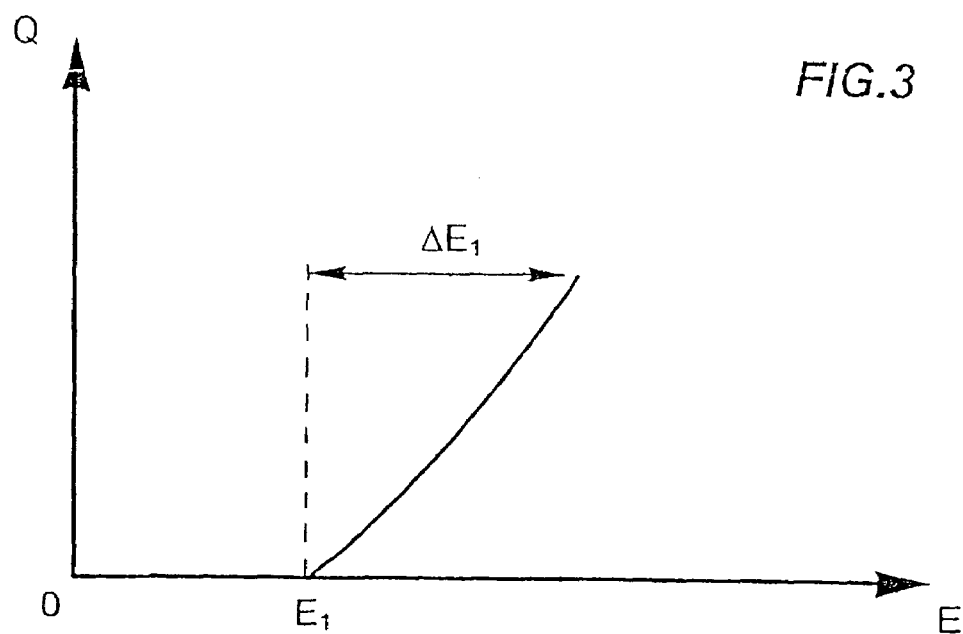

FIG. 3 shows the shape of the function Q(E) (where E is the energy of the incident photon that gave rise to the voltage pulse V) associated with the device 100. This curve Q(E) is characterized by a detection threshold $E_1$ corresponding to a voltage pulse, the peak $V_{max}$ of which is equal to the voltage $V_1$. An increasing portion can then be observed, at least over an energy band of the photons $\Delta E_1$ corresponding to a range of values $\Delta V_1$ of V over which the circuit 3 behaves faithfully in the manner described above.

In the case when it is necessary, for the application envisaged, to have a linear increase, it will be possible for example to replace the diffusion zone $D_3$ with an NMOS transistor, the gate of which will be polarized to a potential higher than the largest value expected for $V_{max}$; or alternatively, it will be possible to connect the plate of a capacitor, the other plate of which is polarized to a fixed potential, to the diffusion zone $D_3$.

Figure 4:
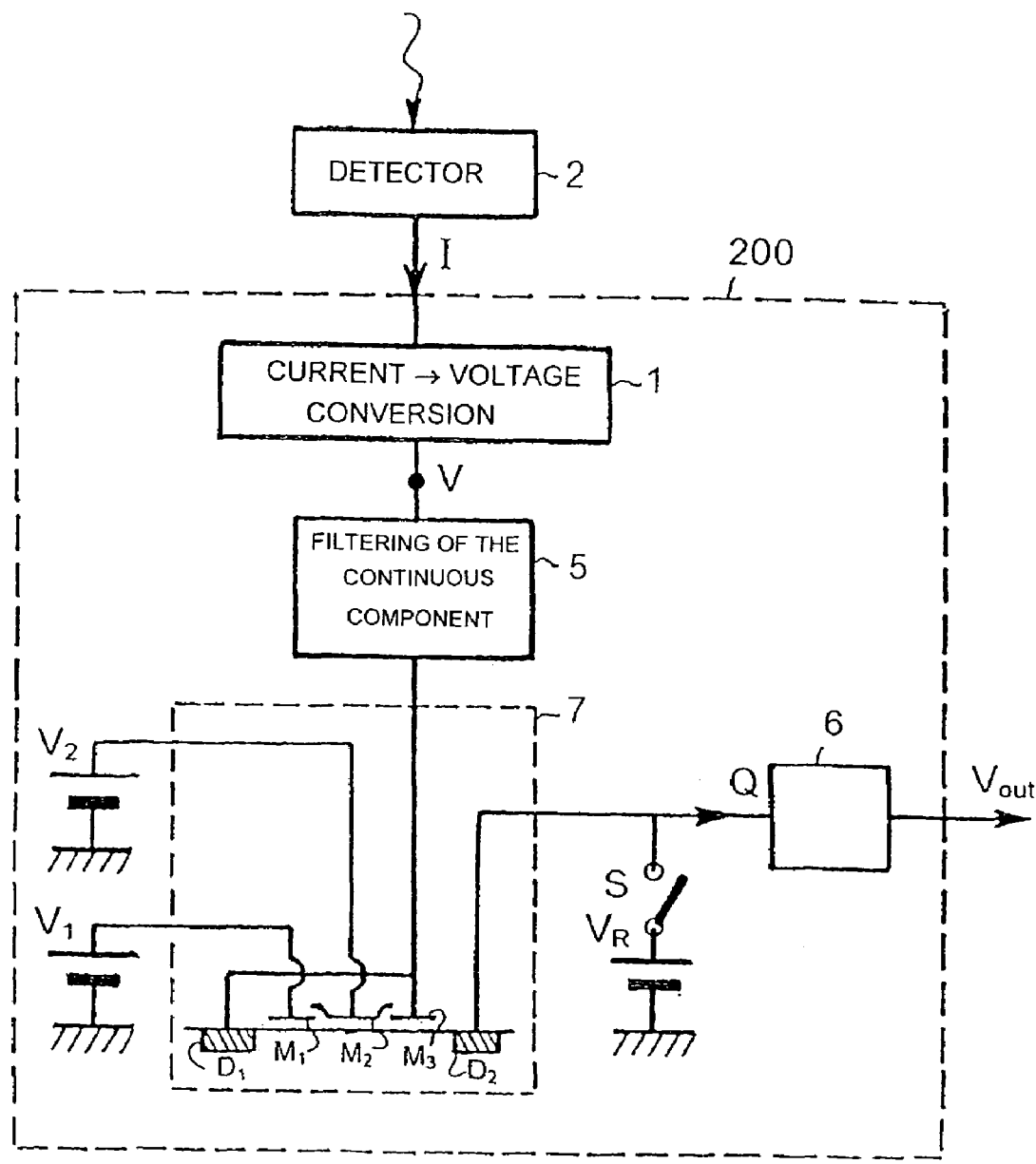

FIG. 4 represents, according to a second embodiment of the invention, a device 200 that is intended for processing the signals emitted by a photon detector 2.

This device 200 only differs from the device 100, and more precisely the circuit 7 only differs from circuit 3, in the replacement of diffusion zone $D_3$ with an NMOS transistor $M_2$, the gate of which is brought to a fixed potential $V_2$.

FIG. 5 represents the main stages in the operation of the device shown in FIG. 4 for a photon, the energy E of which is below $E_2$, where $E_2$ corresponds to a voltage pulse, the peak $V_{max}$ of which is equal to the voltage $V_2$.

The operation of the device in this case is completely analogous to the operation described with reference to FIG. 2. It is true that in the present device, when E is greater than $E_1$ (the value that corresponds to a voltage pulse, the peak $V_{max}$ of which is equal to the voltage $V_1$), a stage is reached (starting from FIG. 5b) where a certain charge $Q_2$ is isolated in the channel of $M_2$, which was not the case with the device in FIG. 1; but the value of this charge $Q_2$ has no effect on the functioning of the present device if E is lower than $E_2$.

Therefore let us examine, referring to FIG. 6, the main stages in the operation of the device 200 for a photon, the energy E of which is greater than the said value $E_2$.

Figure 5A:
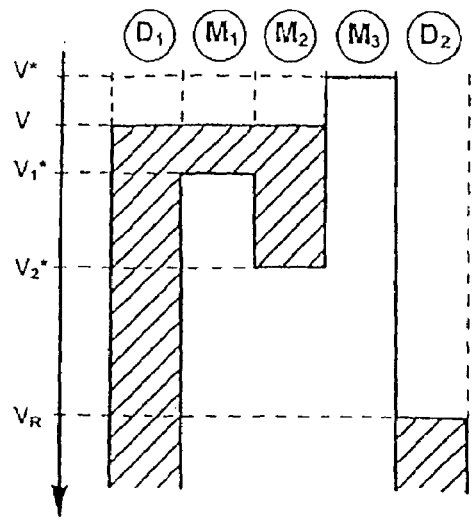
FIGS. 5 and 6 represent the main stages in the operation of the device shown in FIG. 4, FIG. 7 schematically represents the relationship between the energy E of an incident photon and the analogue quantity Q that is associated with it, when using the device shown in FIG. 4, FIG. 8 schematically represents a device according to a third embodiment of the invention, and FIGS. 9a to 9d schematically represent the relationship between the energy E of an incident photon and the analogue quantity Q that is associated with it, when using the device shown in FIG. 8 according to four different settings, presented here as examples.
Figure 5B:
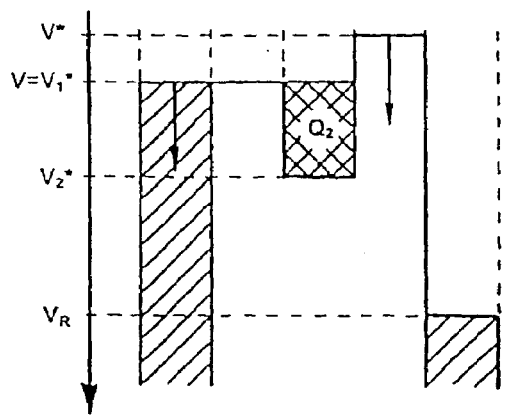
Figure 5C:
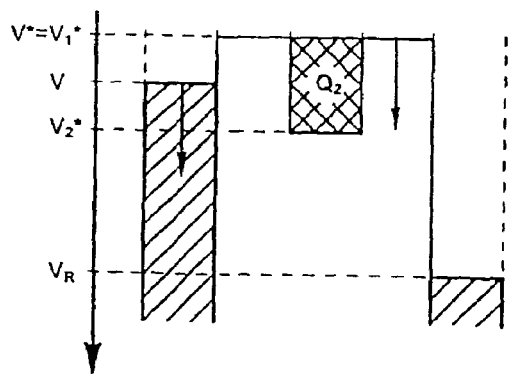
Figure 5D:
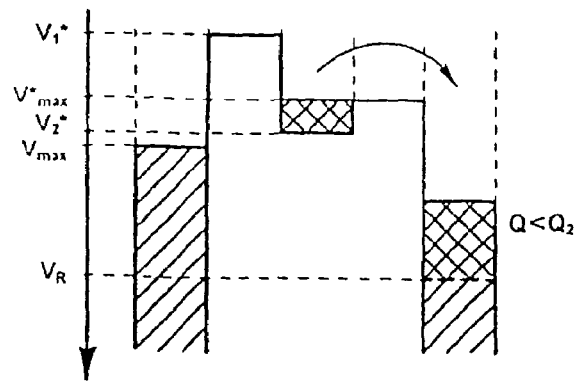
Figure 6A:
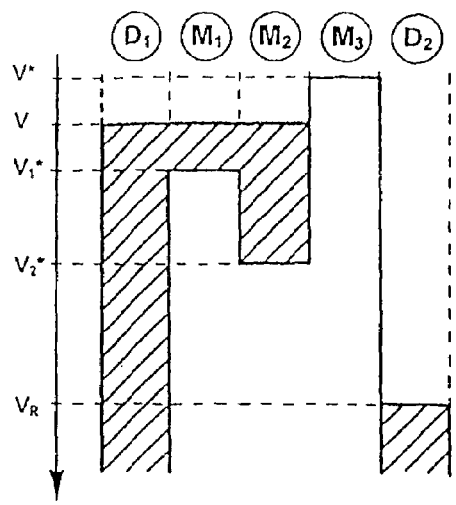
Figure 6B:
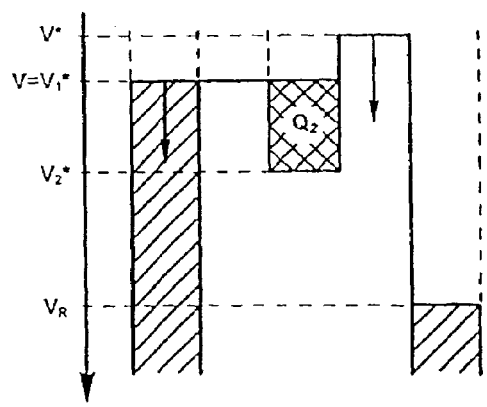
Figure 6C:
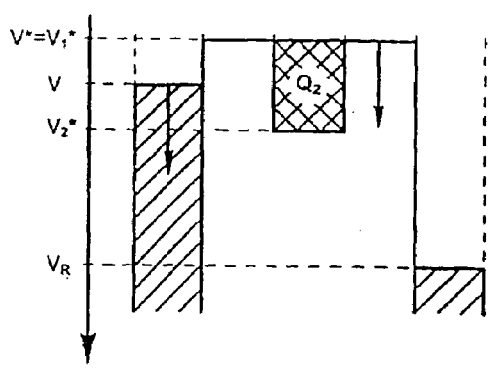
Figure 6D:
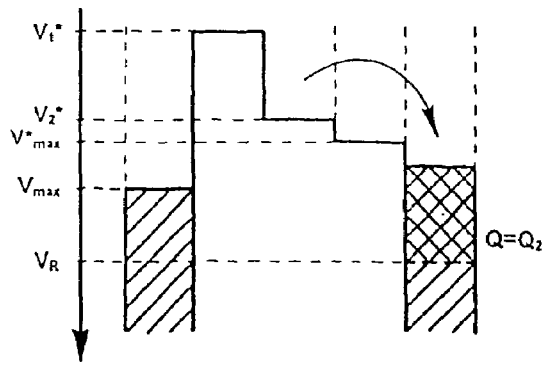

The stages illustrated in FIGS. 6a to 6c are identical to the respective stages illustrated in FIGS. 5a to 5c. Then the charge $Q_2$ flows as previously from $M_2$ to $D_2$, but, when V continues to increase, we reach a stage (V* is less than $V_2$*, where $V_2$* equal to $V_2$-$\epsilon$, and therefore V is greater than $V_2$) where this charge is exhausted. Therefore when voltage V reaches its maximum $V_{max}$ (FIG. 6d), the charge deposited in $D_2$ is equal to $Q_2$ regardless of the value of this maximum (assumed to be greater than $V_2$).

The return to the initial state (FIG. 6a) is analogous to the return to the initial state in the previous devices.

Figure 7:
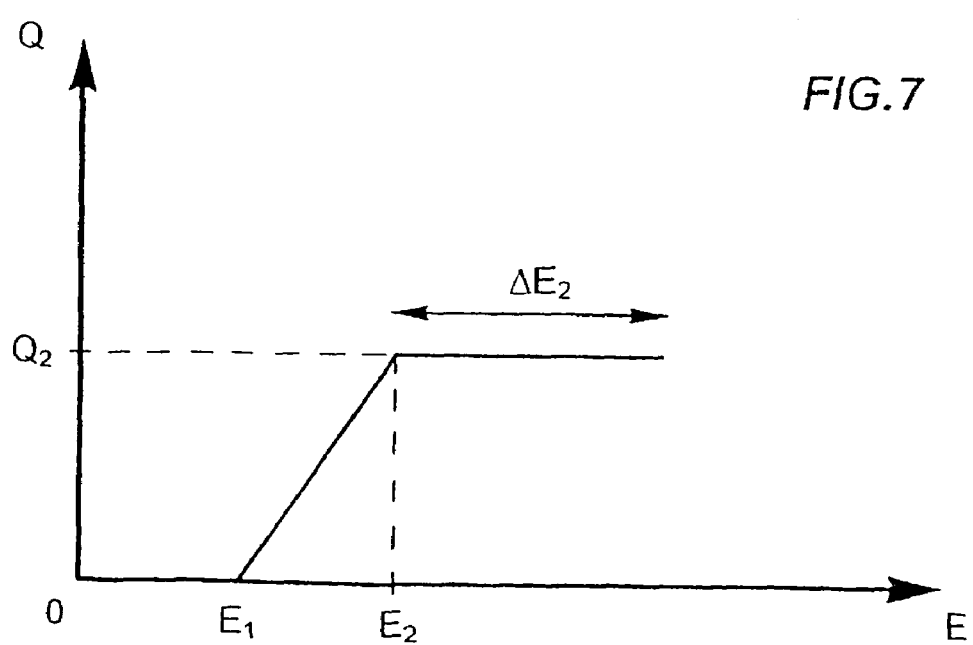

FIG. 7 shows the form of the function Q(E) associated with the device 200.

This curve Q(E) is characterized by a detection threshold $E_1$, followed by a rising portion, the slope of which is determined by the capacity of $M_2$. Then the function remains constant at a value $Q_2$ equal to Q($E_2$), at least over a photon energy band $\Delta E_2$ corresponding to a range of values $\Delta V_2$ of V above $V_2$, over which the circuit 7 behaves faithfully in the manner described above.

Figure 8:
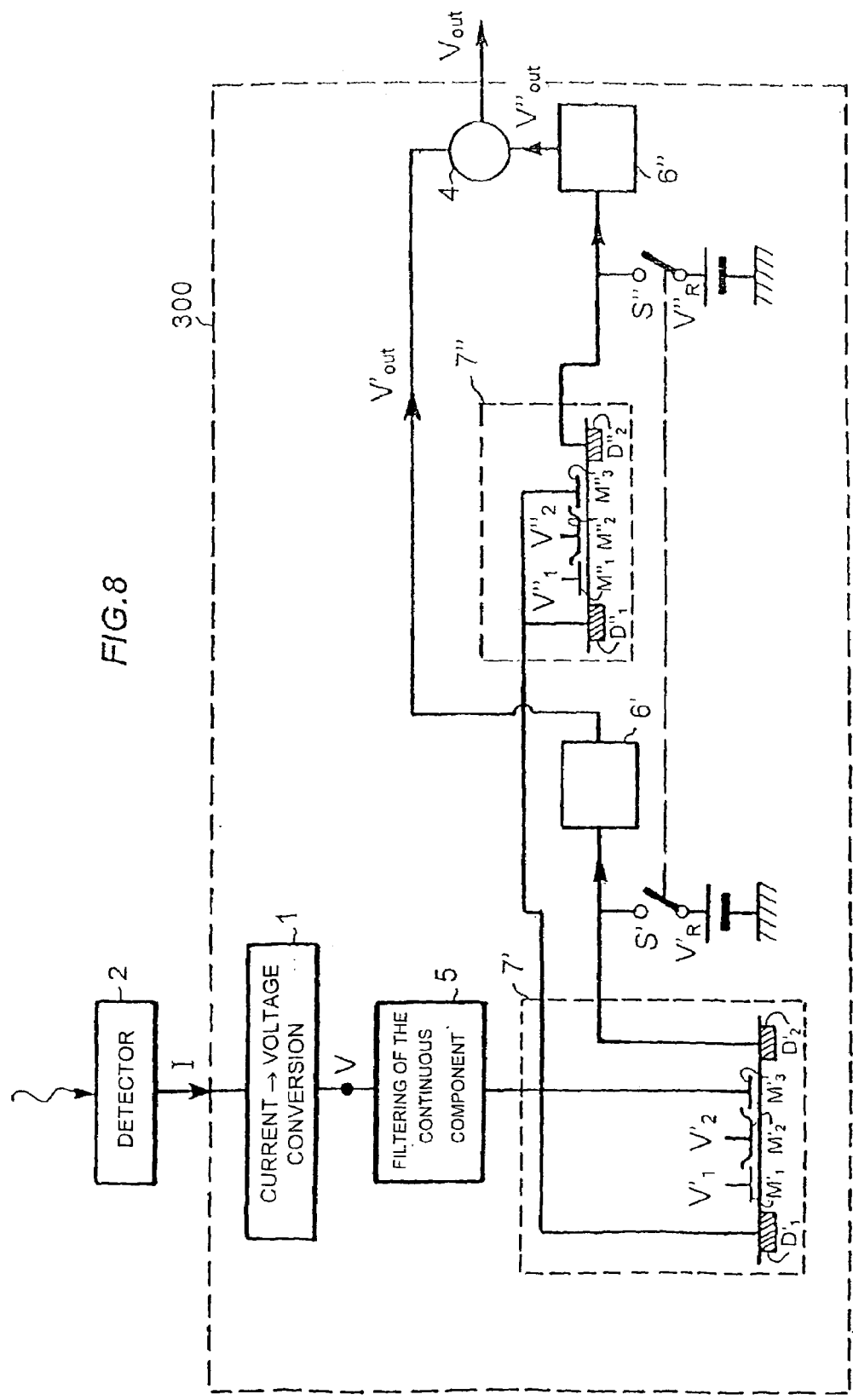

FIG. 8 represents, according to a third embodiment of the invention, a device 300 that is intended for processing the signals emitted by a photon detector 2.

This device 300 comprises, in addition to a current-to-voltage conversion unit 1 and (optionally) a filtering unit 5, two circuits 7' and 7" that are functionally similar to the circuit 7 of the device 200. The charges Q' and Q" accumulated respectively on D'$_2$ and D"$_2$ produce, after measurement in units 6' and 6", respective output signals V'$_{out}$ and V"$_{out}$ which are sent to an analogue subtractor 4, so that the output signal from device 300 is $V_{out}$ equal to V'$_{out}$-V"$_{out}$.

FIGS. 9a to 9d show the form of the function Q(E) (where Q is defined here as being equal to (Q'-Q")) associated with the device 300, for various values of V'$_1$, V'$_2$, Q'$_2$, V"$_1$, V"$_2$, and Q"$_2$.

Figure 9A:
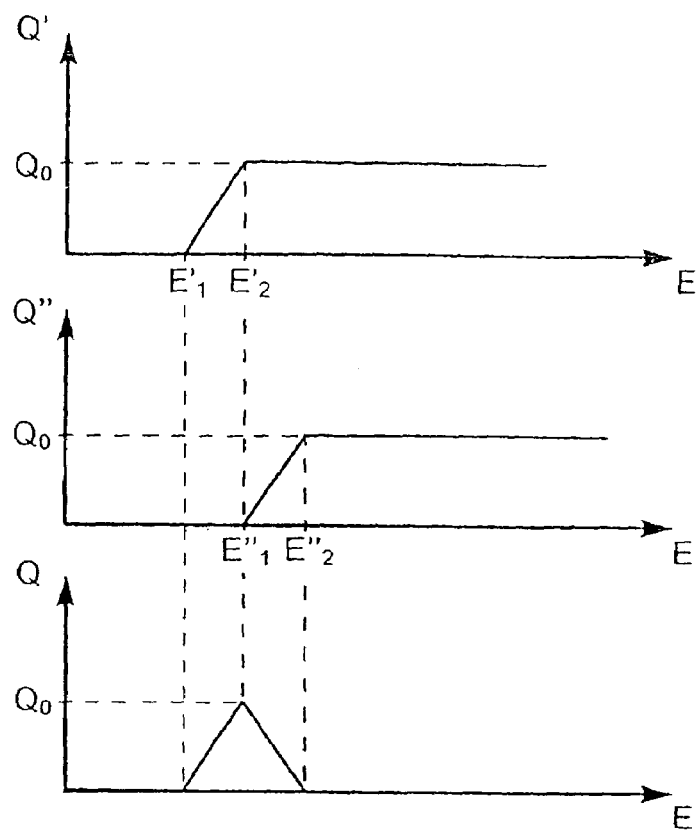
Figure 9B:
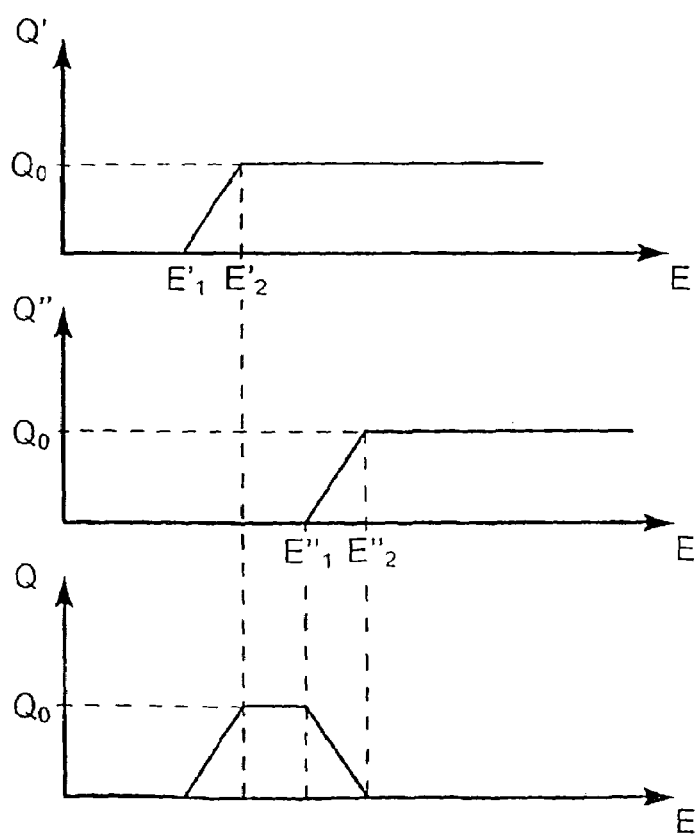
Figure 9C:
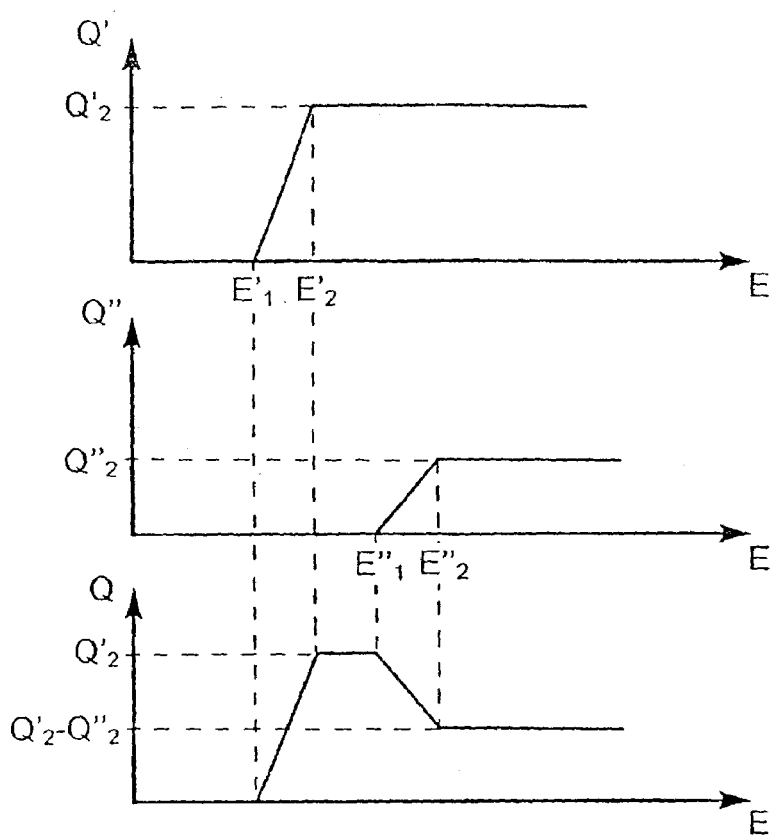
Figure 9D:
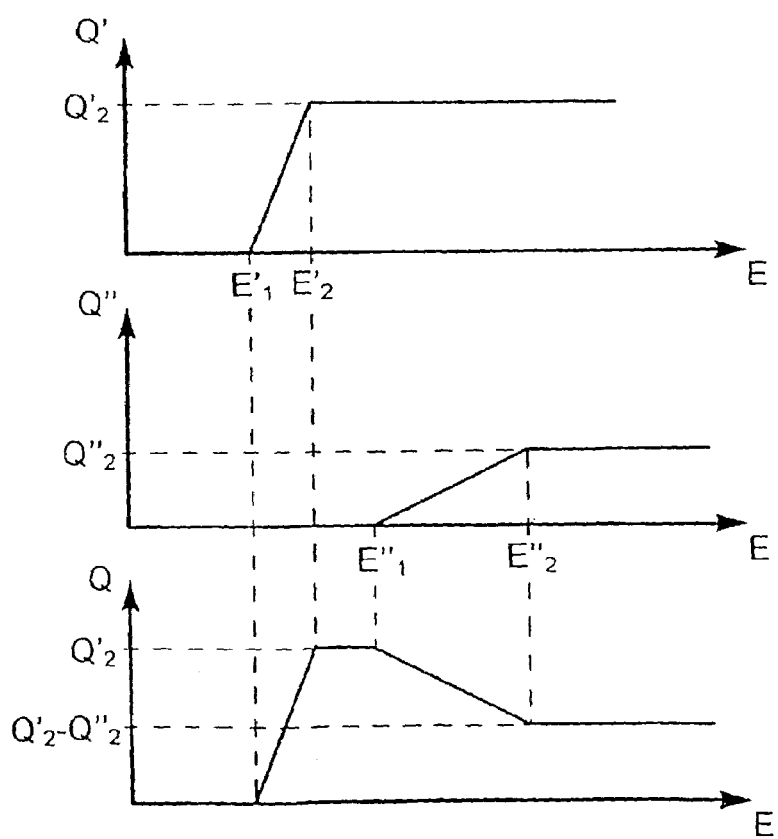

In the case of FIG. 9a, a common value ($Q_0$) is taken for $Q'_2$ and $Q''_2$, and equal capacities for $M'_2$ and $M''_2$ (so as to obtain equal slopes in the rising part of the functions $Q'(E)$ and $Q''(E)$), and in addition: $V'''_1$ equal to $V'_2$. We then obtain a triangular curve $Q(E)$.

It may be desired to broaden the top of this curve, so that it becomes more like a tooth, or a Gaussian curve. To do this (referring to FIG. 9b), it is sufficient to take $V'''_1$ greater than $V'_2$.

By taking $Q'_2$ greater than $Q''_2$ (FIG. 9c), a strobe pulse is obtained which maintains a non-zero value of Q beyond E equal to $E''_2$.

Taking different capacities for $M'_2$ and $M''_2$ (FIG. 9d), asymmetric slopes for the rising part and the falling part of $Q(E)$ are obtained.

On the basis of these few examples, a person skilled in the art will easily be able to choose from among the numerous possible settings of parameters so as to obtain the required function $Q(E)$ according to the application in question, among a large range of possible functional forms.

Furthermore, it is self-evident that the devices shown in FIGS. 1, 4 and 7 are deliberately simple examples of applications that are able to supply the functions $Q(E)$ shown in FIGS. 3, 7 and 9 respectively. In practice, a person skilled in the art will be able to modify them by known techniques, so as to give them secondary advantages such as insensitivity to parasitic noise, a rate of charge transfer through the device that is sufficiently fast, or stability of the current sources, amplifiers or transformers used.

Moreover, for the purpose of clarity, it was assumed in the above description that the voltage pulse at the output of the current/voltage converter is positive. In the case of negative pulses, a person skilled in the art will have no difficulty in adapting the devices described, for example by replacing the NMOS transistors with PMOS transistors (with hole conduction).

The invention was described above referring to the analogue charge Q accumulated on a detector which can be either a single detector, or an individual pixel within a multipixel detector, i.e. made up of a matrix or block of pixels.

In the case of a multipixel detector, there is certainly no reason why, if necessary, the analogue charges accumulated on several of these pixels should not be summed. This summation offers for example a particular advantage in the case of counting, if it is assumed that the energy of the photons to be counted is, as is often the case, within a relatively narrow band positioned slightly above a counting threshold $E_2$. The present invention then makes it possible to correct the counting errors that might result from the fact that a certain photon arrives between two pixels (which gives rise, at the output of each pixel, to signals $I_1$ and $I_2$, the sum of which is equal to the signal I that would have been produced if the said photon had arrived inside a single pixel).

This is because, if a conventional device is used, neither of these two signals $I_1$ and $I_2$ will be sufficient to trigger the counter associated with the respective pixel, so that the said photon will not be counted. Conversely, if a device according to the invention is used, an analogue quantity $Q_1$ proportional to $I_1$, and an analogue quantity $Q_2$ proportional to $I_2$ will be recorded, so that the sum Q equal to $Q_1+Q_2$ will be roughly equal to $Q_2$, and this photon will be counted correctly.

It will be noted in conclusion that the present invention can be considered overall from a different point of view from that presented in the introduction. In fact, the many examples presented in detail above illustrate the fact that the signal processing according to the invention leads to an analogue charge Q which represents, in a predetermined manner, the energy E of the incident photons. In other words, the function $Q(E)$ performs the role of a "weighting function" by means of which we can ascribe, if necessary, a different "weight" to each photon according to its energy. It has also been shown, in the case of the weighting functions presented, how they can be obtained concretely by means of devices using conventional analogue electronic components. Taking inspiration from these examples, a person skilled in the art will be able to elaborate a suitable device for obtaining essentially any desired weighting function depending on the application envisaged, or even a device offering possibilities for adjustment allowing various forms of weighting curves to be obtained, suitable for a range of applications envisaged.

The invention claimed is:

1. A method of processing a signal emitted by a particle detector, the method comprising:
    detecting portions of the signal above a predetermined value $V_1$;
    measuring a maximum value $V_{max}$ reached by the signal in each of the portions; and
    assigning to each of the portions an analogue quantity Q which, at least over a predetermined range of values $\Delta V_1$ of the maximum value $V_{max}$, is an increasing function of $(V_{max}-V_1)$; and
    assigning to each of the portions an analogue quantity Q which is an increasing function of $(V_{max}-V_1)$ if the maximum value $V_{max}$ is below a second predetermined value $V_2$, and remains at a constant value $V_{max}=V_2$ if the maximum value $V_{max}$ is above the second predetermined value $V_2$, at least over a predetermined range of values $\Delta V_2$ of the maximum value $V_{max}$.

2. The method of signal processing according to claim 1, wherein the value of $V_1$ is at least equal to the average level of background noise present in the signal emitted by the particle detector.

3. The method of signal processing according to claim 1, wherein, over the range of values $\Delta V_1$ of $V_{max}$, the said analogue quantity Q is proportional to $(V_{max}-V_1)$.

4. A method of signal processing according to claim 3, further comprising assigning to each of the portions an analogue quantity Q that is proportional to $(V_{max}-V_1)$ if the maximum value $V_{max}$ is below a second predetermined value $V_2$, and that remains at a constant value $V_{max}=V_2$ if the maximum value $V_{max}$ is above the second predetermined value $V_2$, at least over a predetermined range of values $\Delta V_2$ of the maximum value $V_{max}$.

5. The method of signal processing according to claim 1 further comprising assigning to each of the portions an analogue quantity Q that is an increasing function of $(V_{max}-V_1)$ if the maximum value $V_{max}$ is below a second predetermined value $V_2$, and that remains at a constant value $V_{max}=V_2$ if the maximum value $V_{max}$ is between the second predetermined value $V_2$ and a third predetermined value $V_3$, and that is a decreasing function of $V_{max}$ if the maximum value $V_{max}$ is above the third predetermined value $V_3$, at least over a predetermined range of values $\Delta V_3$ of the maximum value $V_{max}$.

6. The method of signal processing according to claim 1, wherein the particles detected by the particle detector comprise photons.

7. A device for processing a signal produced by a particle detector, the device comprising:

a conversion unit configured to convert any current pulse emitted from the detector into a voltage pulse V;

an analogue circuit comprising an electric charge storage device, a first electric charge receiver which can be fed by the electric charge storage device in a manner controllable by means of the voltage pulse V, and a second electric charge receiver which can also be fed by the charge storage device $D_3$ in a manner controllable by means of the voltage V; and an apparatus for measuring the electric charge Q contained in the second charge receiver, wherein the analogue circuit is configured so that each voltage pulse V produces the following effects successively within the said device:

the charge storage device is isolated from the first charge receiver, the charge storage device is connected to the second charge receiver when the voltage V exceeds a predetermined value $V_1$, an electric charge Q that is an increasing function of $(V-V_1)$ passes from the charge storage device to the second charge receiver, the connection between the charge storage device and the second charge receiver is cut when the voltage V begins to decrease after reaching a maximum value $V_{max}$, and the charge storage device is reconnected to the first charge receiver which restores in the charge storage device the charge Q that was lost.

8. The device according to claim 7, wherein the device is configured for processing the signals produced by a set of particle detectors, and wherein at least one of the signals is processed by means of the device.

9. The device according to claim 7, and wherein the particles detected by the particle detector comprise photons.

10. The device according to claim 7, wherein the device comprises a radiology apparatus.

11. The device according to claim 7, wherein the device comprises a video imaging apparatus.

12. The device according to claim 7, wherein the device comprises a fluoroscopy apparatus.

13. A device for processing the signal produced by a particle detector, the device comprising:

a conversion unit configured to convert any current pulse emitted from the particle detector into a voltage pulse V;

an analogue circuit comprising a charge storage device, a first electric charge receiver configured to be fed by the charge storage device in a manner controllable by means of the voltage pulse V, and a second electric charge receiver configured to be fed by the charge storage device in a manner controllable by means of the voltage V; and an apparatus for measuring the electric charge Q contained in the second charge receiver, wherein the analogue circuit is configured so that each voltage pulse V produces the following effects successively within the said device:

the charge storage device is isolated from the first charge receiver, the charge storage device is connected to the second charge receiver when the voltage V exceeds a first predetermined value $V_1$, an electric charge Q proportional to $(V-V_1)$ if the voltage V does not exceed a second predetermined value $V_2$, or proportional to $(V_2-V_1)$ if the voltage V exceeds the said second value $V_2$, passes from the charge storage device to the second charge receiver, the connection between the charge storage device and the second charge receiver is cut when the voltage V begins to decrease after reaching a maximum value $V_{max}$, and the charge storage device is reconnected to the first charge receiver which restores, in the charge storage device, the charge Q that was lost.

14. A device for processing a signal produced by a particle detector, the device comprising:

two analog circuits each configured according to claim 13 and receiving a voltage pulse V emitted from a conversion unit, wherein parameters of the two analog circuits are controlled independently of one another; and an analogue subtractor configured to produce an output signal equivalent to the difference Q between respective first and second analogue charges transferred to two respective second charge receivers contained in the two analog circuits.

* * * * *

UNITED STATES PATENT AND TRADEMARK OFFICE
CERTIFICATE OF CORRECTION

PATENT NO. : 7,183,550 B2 Page 1 of 1
APPLICATION NO. : 10/451943
DATED : February 27, 2007
INVENTOR(S) : Marc Arques It is certified that error appears in the above-identified patent and that said Letters Patent is hereby corrected as shown below:

<u>On the Title Page</u>

In column 1, after item (76), insert a new item as follows:
--Assignee: Commissariat a L'Energie Atomique, Paris (FR)--.

Signed and Sealed this

Twenty-seventh Day of November, 2007

JON W. DUDAS
*Director of the United States Patent and Trademark Office*